(12) United States Patent
Lee et al.

(10) Patent No.: US 7,005,668 B2
(45) Date of Patent: Feb. 28, 2006

(54) METHOD FOR IMPROVING HOLE MOBILITY ENHANCEMENT IN STRAINED SILICON P-TYPE MOSFETS

(75) Inventors: Minjoo L. Lee, Cambridge, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/603,712

(22) Filed: Jun. 25, 2003

(65) Prior Publication Data
US 2004/0053470 A1    Mar. 18, 2004

Related U.S. Application Data

(60) Provisional application No. 60/391,452, filed on Jun. 25, 2002.

(51) Int. Cl.
*H01L 29/06*   (2006.01)
(52) U.S. Cl. ............................. 257/19; 257/18; 257/20; 257/350
(58) Field of Classification Search ............ 257/18–20, 257/350
See application file for complete search history.

(56) References Cited

U.S. PATENT DOCUMENTS

| | | | | |
|---|---|---|---|---|
| 5,426,316 | A * | 6/1995 | Mohammad | 257/197 |
| 5,906,951 | A * | 5/1999 | Chu et al. | 438/751 |
| 6,350,993 | B1 * | 2/2002 | Chu et al. | 257/19 |
| 6,399,502 | B1 * | 6/2002 | Hernandez et al. | 438/692 |
| 6,562,703 | B1 * | 5/2003 | Maa et al. | 438/518 |
| 6,805,962 | B1 * | 10/2004 | Bedell et al. | 428/446 |
| 2002/0052084 | A1 | 5/2002 | Fitzgerald | |

OTHER PUBLICATIONS

"Characteristics and Device Design of Sun-100nm Strained Si N- and PMOSFETs"; Rim et al., 2002 Symposium on VLSI Technology Digest of Technical Papers.

Hole mobility enhancements and alloy scattering-limited mobility in tensile straines Se/SiGe surface channel metal-oxide-semiconductor field-effect transistors: Leitz et al., Journal of Applied Physics, vol. 92, No. 7; Oct. 1, 2002; pp. 3745-3751.

"Channel width dependence of mobility in Ge channel modulation-doped structures;" Irisawa et al. *Jpn. J. Appl. Phys.* Apr. 2001. vol. 40.

"Thermal stability of Ge channel modulation doped structures," Irisawa et al. *Journal of Crystal Growth.* 2001. vol. 227-228.

"Hall mobility enhancement caused by annealing $Si_{0.2}Ge_{0.8}/Si_{0.7}Ge_{0.3}/Si(001)$ $p$-type modulation-doped heterostructures," Myronov et al. *Applied Physics Letters.* May 2002. vol. 80, No. 19.

"Quantum mechanical modeling of the charge distribution in a $Si/Si_{1-x}Ge_x/Si$ P-Channel MOSFET," Hargrove et al. *Proceedings of the 1994 IEEE International Electron Devices Meeting,* San Francisco, CA. Dec. 1994.

"Characteristics and device design of Sub-100 nm Strained Si N- and PMOSFETs,"; Rim et al. *Symposium on VLSI Technology Digest of Technical Papers.* 2002.

"Enhanced performance of strained-Si MOSFETs on CMP SiGe Virtual Substrate," Sugii et al. *International Electron Devices Meeting 2001.* IEDM. Technical Digest.

(Continued)

*Primary Examiner*—Allan R. Wilson
(74) *Attorney, Agent, or Firm*—Gauthier & Connors LLP

(57)    ABSTRACT

A method of forming a MOSFET device is provided. The method includes providing a substrate. The method includes forming on the substrate a relaxed SiGe layer having a Ge content between 0.51 and 0.80. Furthermore, the method includes depositing on the relaxed SiGe layer a ϵ-Si layer.

37 Claims, 4 Drawing Sheets

OTHER PUBLICATIONS

"SiGe-On-Insulator (SGOI): Substrate Preparation and MOSFET Fabrication for Electron Mobility Evaluation," Cheng et al. *IEEE International SOI Conference*. Durango, CO. Oct. 2001.

"Ultrahigh room-temperature hole hall and effective mobility in $Si_{0.3}Ge_{0.7}/Ge/Si_{0.3}Ge_{0.7}$ heterostructures," Irisawa et al. *Applied Physics Letters*. Jul. 2002. vol. 81, No. 5.

* cited by examiner

METHOD FOR IMPROVING HOLE MOBILITY ENHANCEMENT IN STRAINED SILICON P-TYPE MOSFETS

This application claims priority from provisional application Ser. No. 60/391,452 filed Jun. 25, 2002, which is incorporated herein by reference in its entirety.

BACKGROUND OF THE INVENTION

The invention relates to the field of p-type MOSFETS, and in particular to improving hole mobility in strained silicon p-type MOSFETS.

Strained silicon grown on relaxed $Si_{1-x}Ge_x$ virtual substrates has been used to fabricate both n- and p-type MOSFETs, which exhibit enhanced carrier mobility compared to bulk silicon. Biaxial tensile strain breaks the six-fold degeneracy of silicon's conduction band, resulting in reduced intervalley scattering in nMOS devices. Furthermore, for in-plane transport, electrons have only the low transverse effective mass ($m_t=0.19m_0$). For $\epsilon$-Si grown on $Si_{0.8}Ge_{0.2}$, the conduction band splitting is large enough to completely suppress intervalley scattering, and no further improvement in electron mobility is gained by increasing the strain in the silicon layer.

Biaxial tensile strain also splits the light-hole/heavy-hole degeneracy in the valence band. Unlike the conduction band, strain also changes the shape of the light-hole valley, resulting in lower in-plane and out-of-plane effective masses. Since the rate of subband splitting in the valence band is known to be lower than for the conduction band, theory predicts that intervalley scattering for holes will not be suppressed until the strain reaches 1.6%, corresponding to growth on a $Si_{0.6}Ge_{0.4}$ buffer. Recent experimental work shows that hole mobility enhancement saturates for $\epsilon$-Si on $Si_{0.6}Ge_{0.4}$, with no further improvement as the virtual substrate Ge content was increased to 50%.

Unlike $\epsilon$-Si nMOS, mobility enhancements in $\epsilon$-Si p-type MOSFETs demonstrate a functional dependence on vertical effective field. While an 80% electron mobility enhancement has been observed in $\epsilon$-Si for vertical fields ranging from 0.1 to 1MV/cm, hole mobility enhancements tend to evolve as the effective field changes, as shown in FIG. 1. For low fields, the hole mobility enhancement typically increases as the vertical field increases. At an intermediate field value, the enhancement peaks and then degrades with further increases in field.

SUMMARY OF THE INVENTION

According to one aspect of the invention, there is provided a method of forming a MOSFET device. The method includes providing a substrate. The method includes forming on the substrate a relaxed SiGe layer having a Ge content between 0.51 and 0.80. Furthermore, the method includes depositing on the relaxed SiGe layer a $\epsilon$-Si layer.

According to another aspect of the invention, there is provided a method of forming a MOSFET device. The method includes providing a substrate. Also, the method includes forming on the substrate a relaxed SiGe layer having a Ge content between 0.51 and 0.80. Furthermore, the method includes forming on the relax SiGe layer a digital alloy structure that comprises alternating layers of $\epsilon$-Si and SiGe having a Ge content between 0.51 and 1 so that the mobility enhancement of the device is constant.

According to another aspect of the invention, there is provided a method if forming a MOSFET device. The method includes providing a substrate. The method includes forming on the substrate a relaxed SiGe layer having a Ge content between 0.51 and 0.80. Furthermore, the method includes depositing on the second SiGe buffer a $\epsilon$-Si layer so that hole mobility enhancement increases with effective field.

According to another aspect of the invention, there is provided a MOSFET device. The MOSFET device includes a substrate. A relaxed SiGe layer is formed on the substrate having a Ge content between 0.51 and 0.80. A $\epsilon$-Si layer is deposited on the relaxed SiGe layer.

According to another aspect of the invention, there is provided a MOSFET device. The MOSFET device includes a substrate. A relaxed SiGe layer is formed on the substrate having a Ge content between 0.51 and 0.80. A digital alloy structure is formed on the relaxed SiGe layer comprising alternating layers of $\epsilon$-Si and SiGe having a Ge content between 0.51 and 1. The mobility enhancement of the device is constant.

According to another aspect of the invention, there is provided a MOSFET device. The MOSFET device includes a substrate. A relaxed SiGe layer is formed on the substrate having a Ge content between 0.51 and 0.80. A $\epsilon$-Si layer is deposited on the relaxed SiGe layer so that hole mobility enhancement increases with effective vertical field.

DETAILED DESCRIPTION OF THE INVENTION

While the benefit gained from suppression of intervalley scattering appears to be saturated in $\epsilon$-Si pMOS, further boosts in hole mobility enhancement should be possible by continuing to increase the Ge content in the relaxed SiGe buffer. This is due to the effective mass of holes in the vertical direction is very low, meaning that some part of the hole's wave function is likely to be present below the $\epsilon$-Si surface channel, even at high vertical fields. Since the band structure of $Si_{1-x}Ge_x$ rapidly becomes Ge-like at x=0.7 to 0.75, the hole effective mass in a relaxed $Si_{1-x}Ge_x$ alloy likewise starts to resemble the low hole effective mass measured in pure Ge. The invention includes techniques to increase the hole mobility enhancement in $\epsilon$-Si pMOS as well as methods for controlling the enhancement as a function of vertical effective field.

Figure 1:
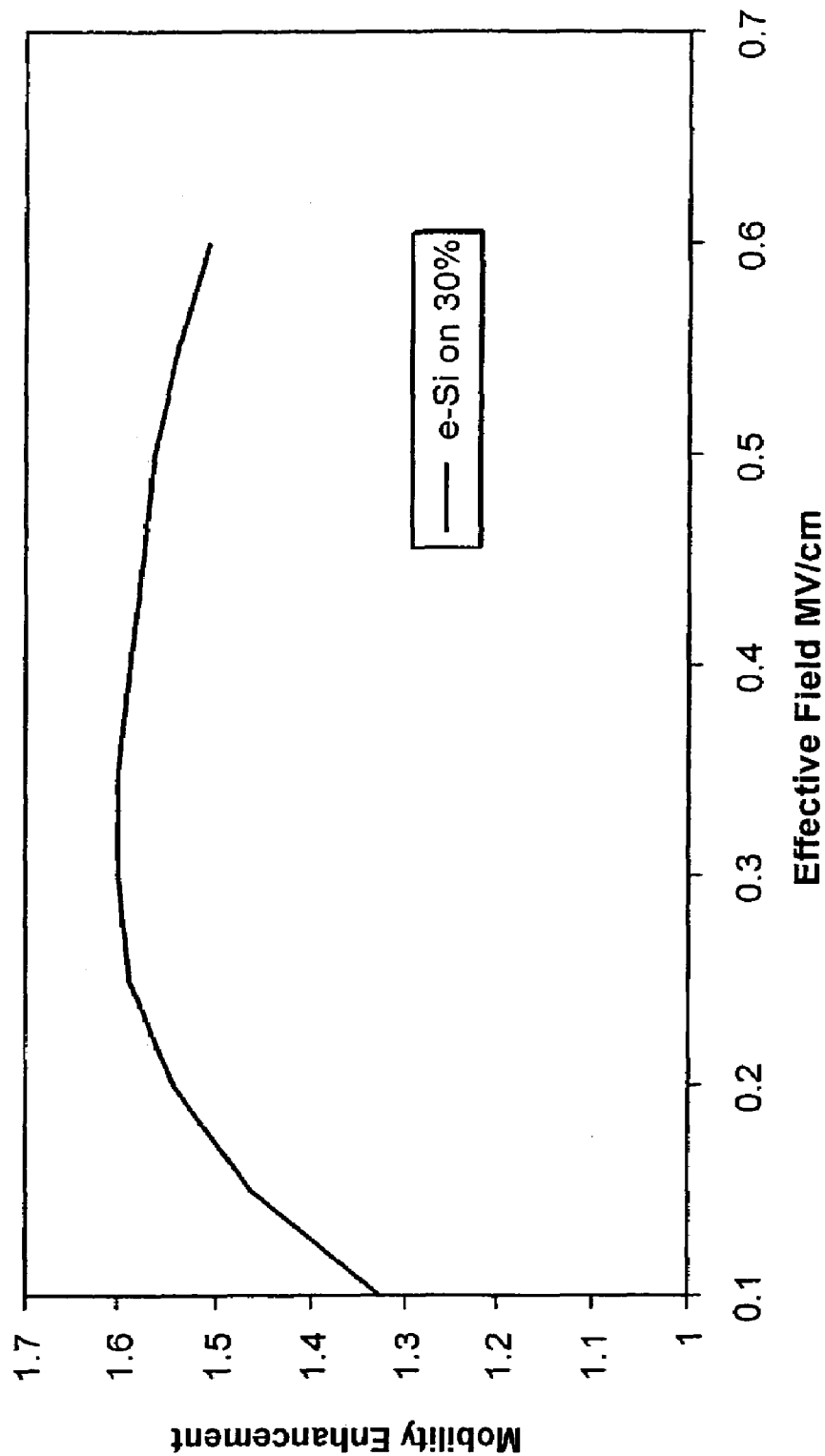
FIG. 1 is a graph demonstrating mobility enhancement as a function of vertical effective field in $\epsilon$-Si p-type MOSFETs.
Figure 2A:
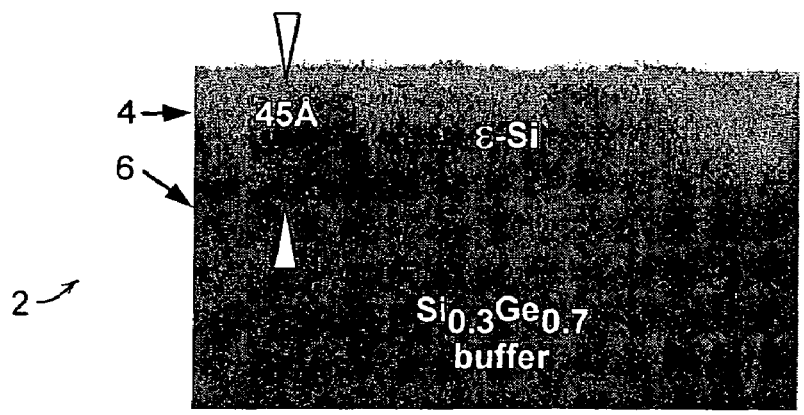
FIG. 2A is a XVTEM diagram demonstrating a $\epsilon$-Si layer grown on a $Si_{0.3}Ge_{0.7}$ buffer.

Relaxed graded SiGe buffers are grown on a crystalline Si substrate to a Ge content of 60% via ultrahigh vacuum chemical vapor deposition (UHVCVD). In other embodiments, the substrate can be a crystalline Si substrate and a relaxed SiGe graded layer, a crystalline substrate and an insulating layer, or the like. The wafers are then removed from the system and subjected to chemo-mechanical polishing (CMP) to remove crosshatch surface roughness and to reduce the density of dislocation pileups. At this point, the relaxed SiGe layer may be transferred to an alternative substrate, such as an SOI wafer, or left as-is. After recleaning, the wafers are reinserted into the UHVCVD for further grading and device layer deposition. A structure 2 is grown comprising of a 45 Å ε-Si layer 4 on a $Si_{0.3}Ge_{0.7}$ relaxed graded buffer 6, as shown in FIG. 2A, and fabricated into long-channel MOSFETs, which utilize a deposited low temperature oxide as the gate dielectric and a single mask level for device patterning. The buffer 6 can have Ge concentrations between 0.51 and 0.8 for effective operation of the invention.

Figure 2B:
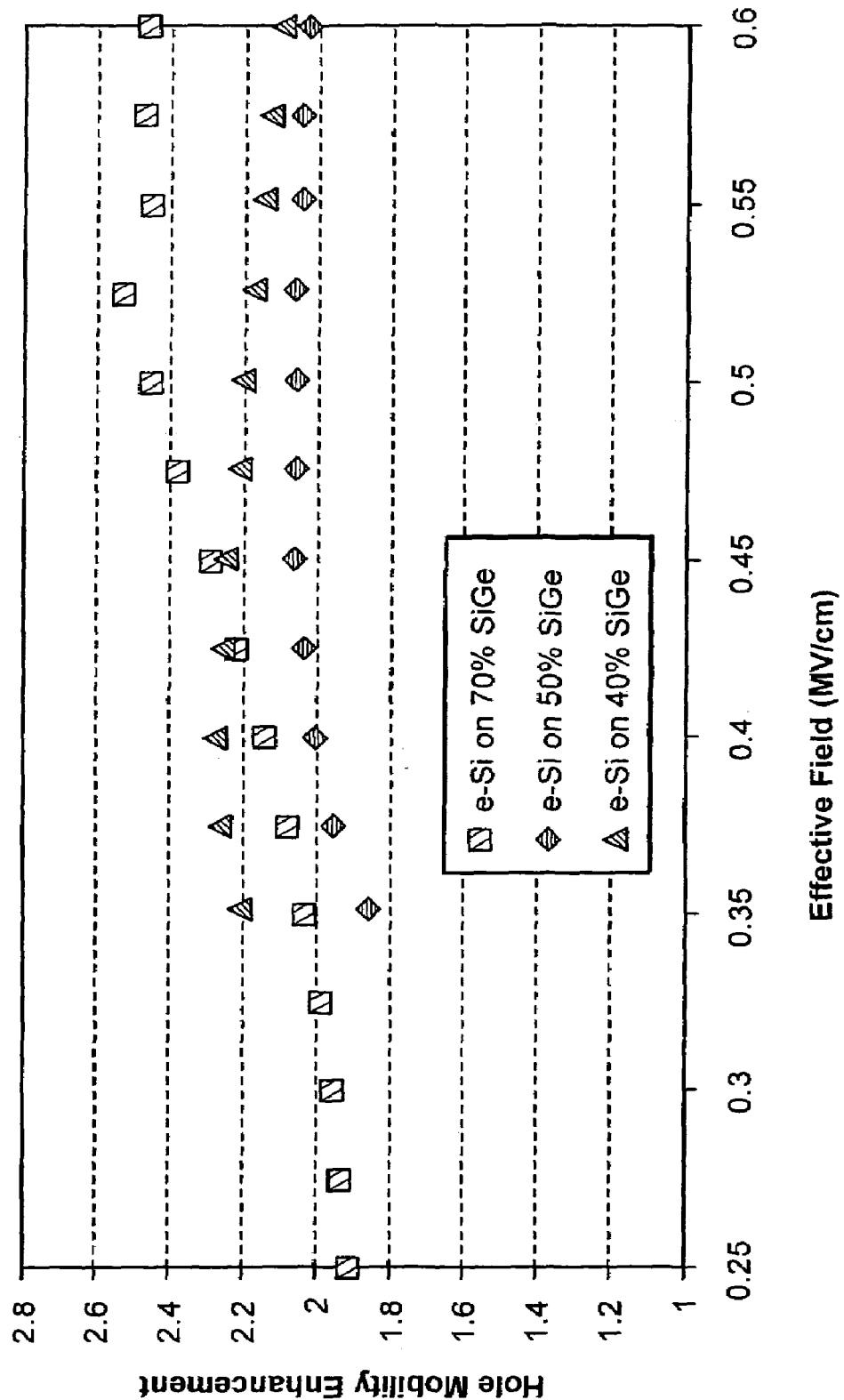
FIG. 2B is a graph demonstrating mobility enhancement of $\epsilon$-Si layer on $Si_{0.3}Ge_{0.7}$ pMOSFET compared to other high-mobility $\epsilon$-Si pMOS structures.

The inversion layer effective mobility is extracted from the linear regime I–V characteristics. The hole mobility enhancement is a function of vertical effective field for this structure, as shown in FIG. 2B, along with other high mobility ε-Si pMOSFETs. As can be seen, the hole mobility enhancement in the ε-Si on $Si_{0.3}Ge_{0.7}$ pMOSFET increases with effective vertical field over a wide field range and saturates at a value of around 2.5. This novel behavior is useful, because it allows for improved pMOSFET performance in deeply scaled devices with large vertical fields. When the inversion layer first forms at low vertical effective fields in this device, the hole wave function is weighted towards the Ge-rich relaxed buffer because of the large valence band offset between strained Si and SiGe (type II alignment).

Mobility enhancement in this regime probably results from the low effective mass of holes in the $Si_{0.3}Ge_{0.7}$ compared to bulk Si. However, because the $Si_{0.3}Ge_{0.7}$ is relaxed, its valence band is degenerate and intervalley scattering is present as a mobility limiting mechanism. As the gate overdrive is increased, the centroid of the wave function is pulled closer and closer to the surface. This shifting of the hole wave function towards the surface ε-Si layer adds the benefit of valence band splitting, resulting in mobility enhancements exceeding those previously seen in ε-Si p-type MOSFETs. Even as the wave function approaches the surface, a significant portion of the wave function's tail should always be present in the relaxed $Si_{0.3}Ge_{0.7}$, because the Si cap is so thin. In this particular demonstration, the Si cap was 45 Å thick, thinner layers provide similar benefits. If the Si cap is grown thick enough to contain all or most of the hole wave function, the hole will lose contact with the $Si_{0.3}Ge_{0.7}$ at high vertical field and some enhancement will be lost. N-MOSFETs with enhanced electron mobility can also be fabricated on the same wafers, making these materials suitable for enhanced-performance CMOS applications.

Figure 3A:
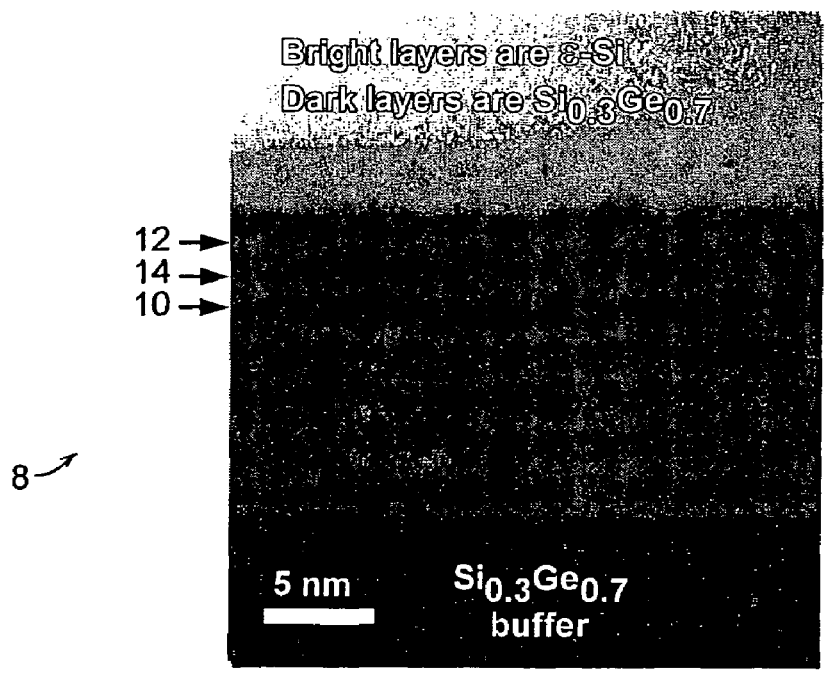
FIG. 3A is a XVTEM diagram demonstrating a $\epsilon$-Si/$Si_{0.3}Ge_{0.7}$ digital alloy structure grown on a $Si_{0.3}Ge_{0.7}$ buffer.

A second structure 8 is grown on a relaxed $Si_{0.3}Ge_{0.7}$ buffer, except that instead of simply capping the structure with ε-Si, the digital alloy 10 consisting of 7 periods of alternating ε-Si 12 and $Si_{0.3}Ge_{0.7}$ 14 layers is grown, as shown in FIG. 3A. Each layer 12, 14 is approximately 8 Å thick, and the entire structure 8 is capped with 20 Å of ε-Si in order to allow the use of a $SiO_2$ gate. When the inversion layer forms in this structure 8, the hole should have enhanced transport from the splitting of the valence band degeneracy as long as the hole wave function is within 120 Å of the surface. The SiGe layers 14 can have Ge concentrations between 0.51 and 0.8.

Figure 3B:
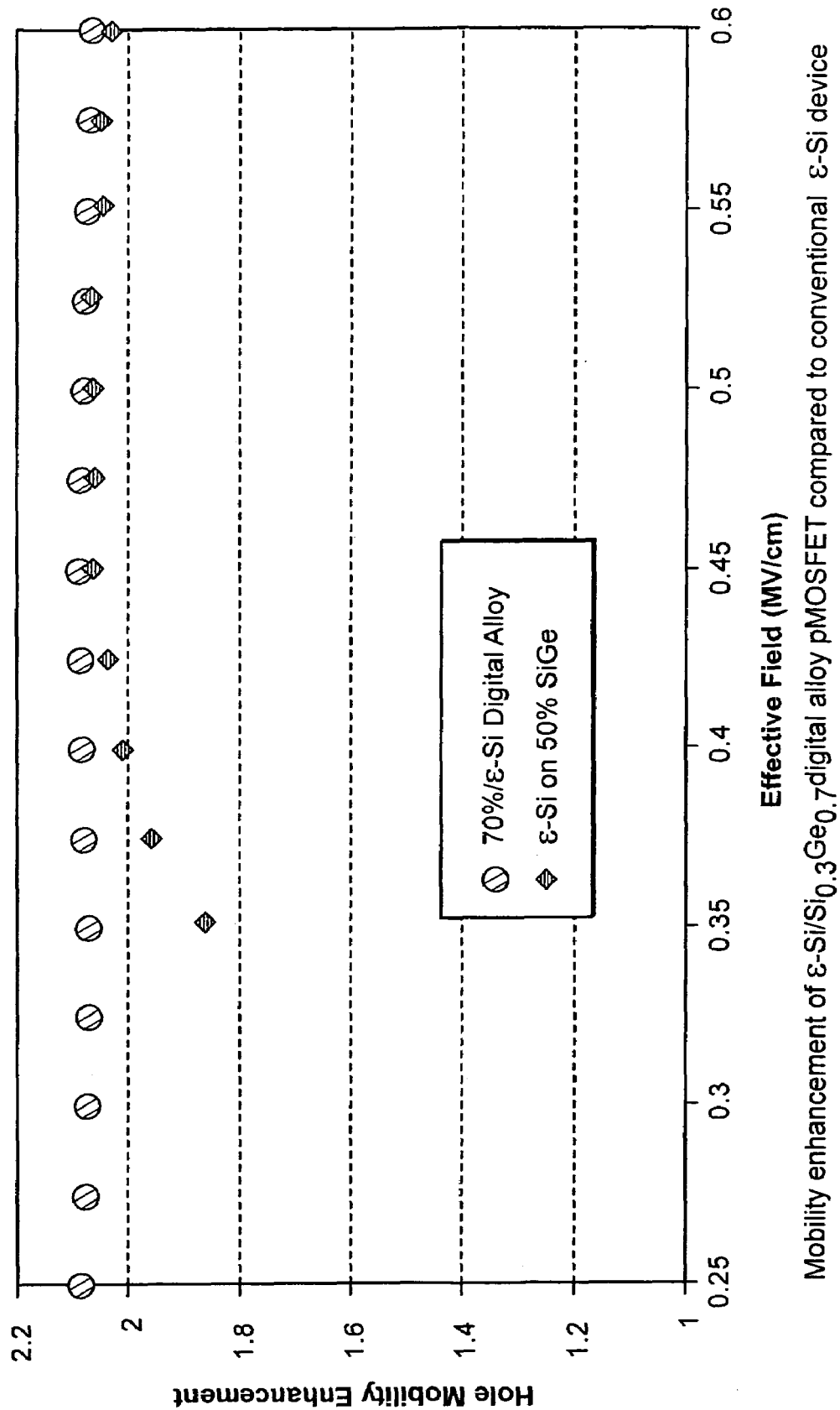
FIG. 3B is a graph demonstrating mobility enhancement of $\epsilon$-Si/$Si_{0.3}Ge_{0.7}$ digital alloy pMOSFET compared to a convention $\epsilon$-Si structure.

As can be seen in FIG. 3B, the mobility enhancement in this device demonstrates no dependence on vertical effective field. This represents a substantial improvement over prior art ε-Si p-MOSFETs, where a constant mobility enhancement had previously been thought to be unattainable. Thus, unlike the conventional ε-Si p-type MOSFET, the digital alloy device does not need to be biased to high vertical field in order for the hole wave function to combine reduced intervalley scattering with the Ge-like effective mass of $Si_{0.3}Ge_{0.7}$. In general, periodic, repeating layer structures (such as the digital alloy described here) are useful for allowing the hole mobility enhancement to be fixed at a constant value with respect to effective field. n-MOSFETs with electron mobility comparable to Cz-Si can also be fabricated from the same digital-alloy material.

It is important to note that despite the fact that the individual layers 12, 14 are extremely thin, the hole is not experiencing the valence band structure of a random alloy. If the valence band structure is that of the average composition of the layers, then the digital alloy could be replaced by a tensile $Si_{0.65}Ge_{0.35}$ layer on a $Si_{0.3}Ge_{0.7}$ buffer. However, according to recent alloy scattering studies, such a structure would actually exhibit hole mobility below that of bulk Si.

Even though valence band splitting in ε-Si saturates for buffer compositions greater than 40% Ge, further mobility enhancements in ε-Si p-type MOSFETs are possible through the use of a high Ge content relaxed buffer. The large enhancements seen at high vertical fields result from a hybrid of the valence band splitting present in the ε-Si cap and the Ge-like effective mass in the $Si_{0.3}Ge_{0.7}$ buffer. Since the ε-Si layer is only 45 Å thick, the hole wave function can always sample the relaxed $Si_{0.3}Ge_{0.7}$ buffer, even as the hole wave function is pulled towards the surface by the vertical field. The digital alloy 10 is a structure designed and grown consisting of alternating layers of $Si_{0.3}Ge_{0.7}$ and ε-Si upon a $Si_{0.3}Ge_{0.7}$ buffer. The alternating layer structure 10 allows the hole wave function to sample both the low effective mass in $Si_{0.3}Ge_{0.7}$ and the valence band splitting in the ε-Si at both low and high vertical field. The use of different compositions in the alternating layers can also lead to greatly enhanced hole mobility. Even though the layers 12, 14 comprising the digital alloy are on the order of several atomic layers thick, the hole is able to combine the unique benefits intrinsic to each "digit" of the alloy.

Although the present invention has been shown and described with respect to several preferred embodiments thereof, various changes, omissions and additions to the form and detail thereof, may be made therein, without departing from the spirit and scope of the invention.

What is claimed is:

1. A MOSFET device comprising:
   a substrate;
   a relaxed SiGe layer that is formed on said substrate, said relaxed SiGe layer having a Ge content between 0.51 and 0.80 and a selective portion having a Ge content between 0.7 and 0.75; and
   a ε-Si layer that is deposited on said relaxed SiGe layer.

2. The MOSFET device of claim 1, wherein said ε-Si layer is sized approximately at 45 Å.

3. The MOSFET device of claim 1, wherein said relaxed SiGe layer is planarized.

4. The MOSFET device of claim 1 further comprising a hole mobility enhancement that increases with effective vertical field.

5. The MOSFET device of claim 4, wherein said hole mobility enhancement saturates approximately around 2.5.

6. The MOSFET device of claim 1, wherein said ε-Si layer shifts the hole wave function away from the surface of said ε-Si layer.

7. The MOSFET device of claim 1, wherein said substrate comprises a crystalline Si substrate.

8. The MOSFET device of claim 1, wherein said substrate comprises a crystalline Si substrate and a relaxed SiGe graded layer.

9. The MOSFET device of claim 1, wherein said substrate comprises a crystalline substrate and an insulating layer.

10. The MOSFET device of claim 9, wherein said insulator layer comprises an oxide.

11. The MOSFET device of claim 1 further comprising a PMOS device.

12. The MOSFET device of claim 11 further comprising a NMOS device.

13. The MOSFET device of claim 12, wherein said PMOS and NMOS devices form a CMOS device.

14. A MOSFET device comprising:
a substrate;
a relaxed SiGe layer that is formed on said substrate, said relaxed SiGe layer having a Ge content between 0.51 and 0.80; and
a digital alloy structure that is formed on said relaxed SiGe layer comprising alternating layers of $\epsilon$-Si and SiGe having a Ge content between 0.51 and 1, wherein said mobility enhancement of said device is constant.

15. The MOSFET device of claim 14, wherein said alternating layers of SiGe and $\epsilon$-Si is sized approximately at 45 Å.

16. The MOSFET device of claim 14, wherein said relaxed SiGe layer is planarized.

17. The MOSFET device of claim 14, wherein said $\epsilon$-Si layer shifts the hole wave function away from the surface of said $\epsilon$-Si layer.

18. The MOSFET device of claim 14, wherein said substrate comprises a crystalline Si substrate.

19. The MOSFET device of claim 14, wherein said substrate comprises a crystalline Si substrate and a relaxed SiGe graded layer.

20. The MOSFET device of claim 14, wherein said substrate comprises a crystalline substrate and an insulating layer.

21. The MOSFET device of claim 20, wherein said insulator layer comprises an oxide.

22. The MOSFET device of claim 14 further comprising a PMOS device.

23. The MOSFET device claim 22 further comprising a NMOS device.

24. The MOSFET device claim 23, wherein said PMOS and NMOS devices form a CMOS device.

25. The MOSFET device of claim 14, wherein said relaxed SiGe layer comprises a selective portion having a Ge content between 0.7 and 0.75.

26. A MOSFET device comprising:
a substrate;
a relaxed SiGe layer that is formed on said substrate, said relaxed SiGe layer having a Ge content between 0.51 and 0.80 and a selective portion having a Ge content between 0.7 and 0.75; and
a $\epsilon$-Si layer that is deposited on said relaxed SiGe layer so that hole mobility enhancement increases with effective vertical field.

27. The MOSFET device of claim 26, wherein said $\epsilon$-Si layer is sized approximately at 45 Å.

28. The MOSFET device of claim 26, wherein said relaxed SiGe layer is planarized.

29. The MOSFET device of claim 26, wherein said hole mobility enhancement saturates approximately around 2.5.

30. The MOSFET device of claim 26, wherein said $\epsilon$-Si layer shifts the hole wave function away from the surface of said $\epsilon$-Si layer.

31. The MOSFET device of claim 26, wherein said substrate comprises a crystalline Si substrate.

32. The MOSFET device of claim 26, wherein said substrate comprises a crystalline Si substrate and a relaxed SiGe graded layer.

33. The MOSFET device of claim 26, wherein said substrate comprises a crystalline substrate and an insulating layer.

34. The MOSFET device of claim 33, wherein said insulator layer comprises an oxide.

35. The MOSFET device of claim 26 further comprising a PMOS device.

36. The MOSFET device of claim 35 further comprising a NMOS device.

37. The MOSFET device claim 36, wherein said PMOS and NMOS devices form a CMOS device.

* * * * *